CONTROLLABLE SEMICONDUCTOR DEVICES WITH A NEGATIVE CURRENT-VOLTAGE CHARACTERISTIC AND METHOD OF THEIR MANUFACTURE

Filed Oct. 21, 1964

2 Sheets-Sheet 2

United States Patent Office 3,321,680

Patented May 23, 1967

3,321,680

CONTROLLABLE SEMICONDUCTOR DEVICES WITH A NEGATIVE CURRENT-VOLTAGE CHARACTERISTIC AND METHOD OF THEIR MANUFACTURE

Heinz-Herbert Arndt, Nurnberg, Jürgen Schädel, Hochstadt, and Theodor Renner, Nurnberg, Germany, assignors to Siemens-Schuckertwerke Aktiengesellschaft, Berlin-Siemensstadt, Germany, a German corporation Filed Oct. 21, 1964, Ser. No. 405,627

Claims priority, application Germany, Oct. 22, 1963, S 87,961

9 Claims. (Cl. 317—234)

Figure 1:
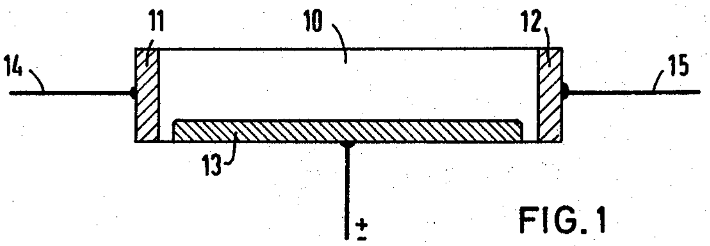

Our invention relates to controllable semiconductor devices having a negative current-voltage characteristic and to a method of producing such devices.

There are various known semiconductor crystal diodes of a partially negative resistance characteristic. Among these are thyristor triodes, switching transistors, and the more recently employed avalanche injection diodes having an operational behavior similar to that of avalanche transistors. An essential shortcoming of the known semiconductor devices of this general type is the fact that they require an appreciable amount of control current for triggering the switching operation.

The semicounductor switching triodes (thyristors) have four sequential regions of alternately different type of conductance and are comparable, as to switching performance, with thyratron (gas-filled) tubes. A switching transistor is a three-layer transistor with a point electrode of tungsten to serve as a fourth (control) electrode. Both devices are rather difficult to manufacture.

In avalanche injection diodes, whose essential semiconductor body comprises three sequential regions of which the two outer ones are highly doped for the same type of extrinsic conductance, the middle region is poorly conducting, either by being only weakly doped for the same conductance type as the two outer regions or by having intrinsic conductance. Avalanche injection diodes are controlled by means of a region which is adjacent to the above-mentioned middle region and has a conductance type opposed to that of the two outer regions. The performance of these diodes is based upon the formation of charge-carrier avalanches in the middle, poorly conducting region. For producing a workable avalanche injection diode, point contacts of very small dimensions are required to keep the currents within sufficiently small limits, these currents being otherwise very high because of the necessary high field strengths involved. To facilitate avalanche formation, the conductance and the dimensions of the middle region may also be reduced in the flow direction of the charge-carrier current. This, however, aggravates the anyhow great difficulties of producing such diodes. The desired sequence of the respective regions is obtained by diffusing and/or alloying impurity atoms into the semiconductor material. In both cases, the same difficulties are encountered with respect to preserving the required geometry of the outer, highly-doped zones.

It is an object of our invention to devise controllable semiconductor switching devices exhibiting a partly negative current-voltage characteristic that are more easily producible and more reliably reproducible with prescribed properties, than those heretofore available.

To this end, and in accordance with a feature of our invention, we produce the controllable semiconductor devices by the following sequence of essential method steps. First the surface of a semiconductor monocrystal having a given type of extrinsic conductance, for example p-type conductance, is provided with an oxide coating. Then the oxide coating is etched away at two places spaced from, but close to, each other to obtain respective window openings in the oxide coating. Thereafter a dopant for producing the opposed conductance type, for example donor substance, is diffused through the two window openings into the semiconductor crystal, thus producing two highly doped n-type regions in the crystal beneath the respective openings. Thereafter the surface of the doped regions is cleaned by etching to remove newly formed oxide, whereafter metal contact electrodes are attached to the respective doped regions and also to the intermediate oxide coating, preferably by vapor-depositing the metal and then alloying the deposit. If the semiconductor monocrystal employed in the process has n-type conductance, an acceptor dopant is diffused into the crystal for forming the two highly doped regions beneath the openings.

The semiconductor device according to the invention, produced by the above-described method, comprises three regions of the same conductance type at one side or edge of a semiconductor main material having the opposed conductance type. Of these three regions, the intermediate one has lower conductance than the two outer, highly doped regions. However, the middle region may also be intrinsically conducting.

A semiconductor device according to the invention is operated as a controlled diode having a partly negative current-voltage characteristic. The control may be effected by passing a current between the semiconductor main material and the intermediate region, this current affecting the shape of the current-voltage curve and the resistance of the intermediate region upon which the amount of the breakdown voltage is dependent. The control may also be effected without control current with the aid of an electrode attached above the intermediate region in insulated relation thereto. This is an essential advantage in view of the fact that the heretofore known avalanche injection diodes require an appreciable amount of control current. The function of the poorly conducting intermediate region, being comparable to the middle region of an avalanche injection diode, is performed in an inversion or depletion layer located at the crystal surface.

If the semiconductor main material consists of p-type silicon, for example, the poorly conducting intermediate region is produced preferably by thermal oxidation of the crystal surface. The resulting silicon dioxide serves simultaneously to insulate the control electrode from the intermediate region and as an alloying and/or diffusion blocking means during the production of the highly doped outer regions.

The two highly doped and highly conductive outer regions are preferably produced by diffusing and/or alloying dopant into two closely adjacent localities of the semiconductor crystal to produce the type of conductance corresponding to that of the narrow intermediate region. The two highly doped regions form respective p-n junctions with the semiconductor main material and, after being contacted with metal electrodes, are operated by applying voltage in the blocking direction relative to the main material. Consequently, the two highly doped outer zones, together with the resulting intermediate inversion layer, form an $n^+$-n (or i)-$n^+$ layer sequence of a $p^+$-p (or i)-$p^+$ layer sequence. A single diffusion step which is relatively non-critical with respect to diffusion temperature, penetrating depth and marginal concentration, thus produces a sequence of three regions having alternately different conductivity.

This rather simple method of producing the novel diodes, lending itself particularly to large-scale production and securing uniform qualities of the respective semiconductor devices produced, constitutes another advantage of the invention over the known avalanche injection diodes. The fact that it has been extremely difficult to produce avalanche injection diodes in large quantities with uniform and constant properties has been a main reason why these devices have not been used extensively in practice.

Figure 2A:
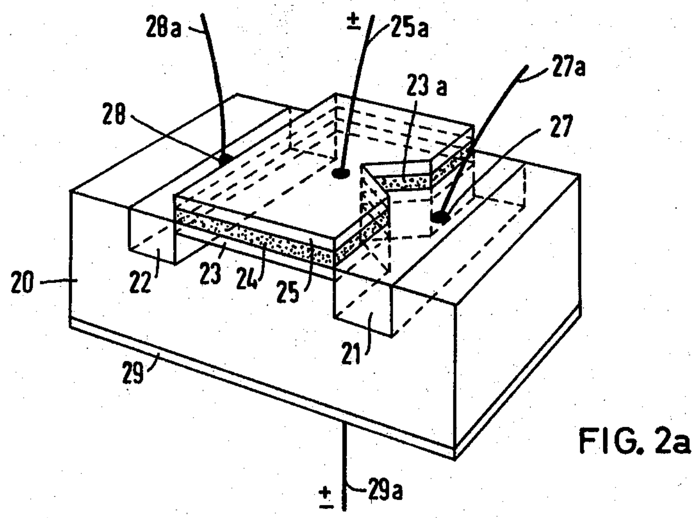
Figure 2B:
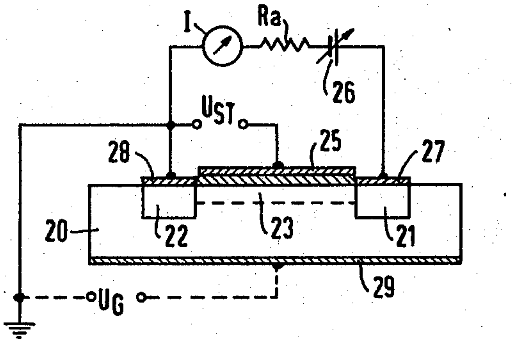
Figure 3:
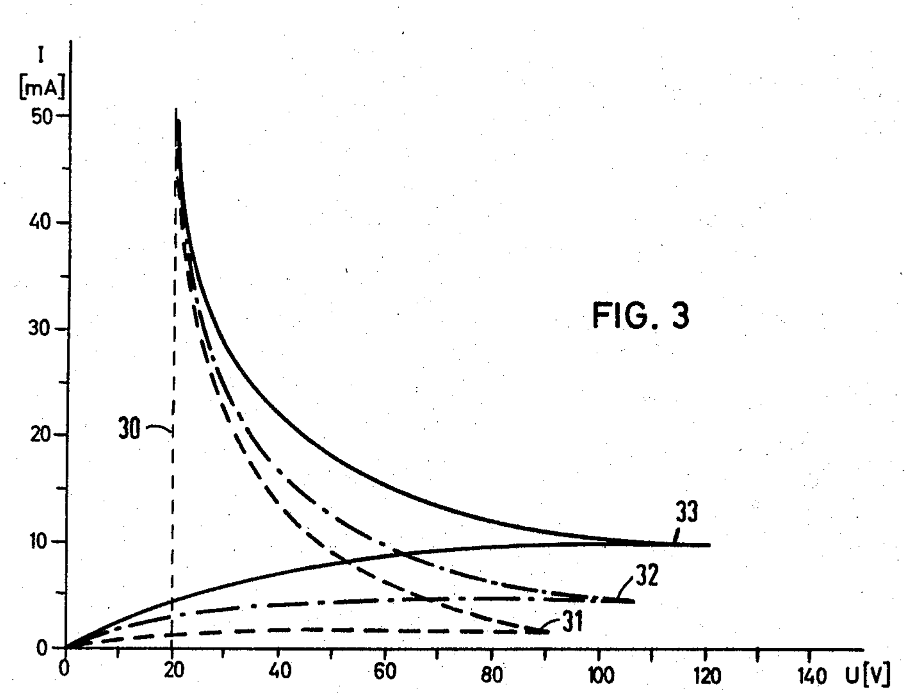
Figure 4:
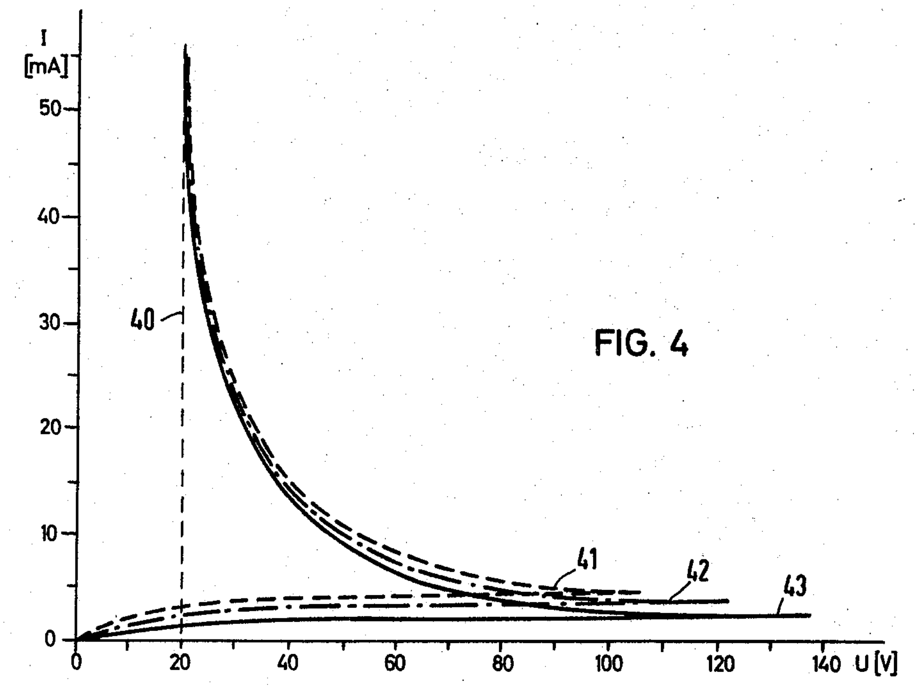

For further describing and explaining the invention, reference will be made to the accompanying drawing in which:

FIG. 1 shows schematically the design of the known avalanche injection diode;

FIG. 2*a*, shows by way of example, a schematic and perspective view of an embodiment of a semiconductor switching device according to the invention;

FIG. 2*b* shows schematically and in section the same switching device according to the invention in conjunction with an electric operating and control circuit; and FIGS. 3 and 4 are explanatory graphs relating to the performance of devices according to the invention.

The devices are illustrated on an enlarged scale.

The known avalanche injection diode schematically shown in FIG. 1 consists essentially of a semiconductor crystal having three regions of the same conductance type of which the middle region 10 has lower conductivity than the two outer regions 11 and 12. The middle region 10 may also consist of intrinsically conducting semiconductor material. For controlling the device, a region of the opposed conductance type 13 is provided adjacent to the middle region 10. The control region 13 operates by charge-carrier injection or extraction and thus modifies the conductance and field distribution in the middle zone. A direct-current source as well as an alternating-current source may be connected between the electrode leads 14 and 15 of the two outer regions 11 and 12.

In the novel semiconductor device according to FIG. 2*a* the main body of the semiconductor monocrystal consists, for example, of p-type silicon having a conductivity of 5 to 1000 ohm/cm. The crystal is provided with a coating 24 of silicon dioxide having a thickness of 0.5 to 1$\mu$. The coating is produced, for example, by vaporization or thermal oxidation. For producing two highly doped regions, the oxide is etched away at two localities with the aid of a conventional, preferably photolithographic masking technique so that strip-shaped window openings are formed at a slight distance from each other, the spacing being 20 to 200$\mu$, preferably about 100$\mu$. It is essential to make this spacing so large that the resulting barrier layers will not touch each other at the highest desired blocking voltage.

The oxide coating remaining between the two windows protects the intermediate region from the effect of the diffusion required for producing the two outer regions. The outer regions 21 and 22 are highly doped with n-doping (donor) material, preferably phosphorus. Relating to a semiconductor body of silicon, the doping is effected by covering the crystal surface in the openings with a $P_2O_5$ containing oxide layer. This is done, for example, by heating the body for about one-half hour at 900° C. in a $P_2O_5$-containing current of oxygen. Subsequently the phosphorus is diffused into the semiconductor body by subjecting the body to tempering for several hours at 1100 to 1200° C. Such doping treatment produces two n-type regions 21 and 22 in the p-silicon crystal 20 beneath the windows of the oxide coatings. Electrodes 27 and 28 are then attached to the surfaces of the respective regions 21 and 22, for example by vapor deposition and subsequent alloying of aluminum. Leads **27*a* and 28*a* are thereafter connected to the respective electrodes 27 and 28**, preferably by thermocompression.

The donor-active impurity atoms contained in the intermediate layer between the silicon and the first produced silicon-dioxide coating produce an inversion layer 23 in the silicon. The regions 21 and 22, together with the n-conducting inversion layer 23 extending between them, thus form the desired $n^+$-n-$n^+$ layer sequence. Located on the oxide coating 24 above the inversion layer 23 is a control electrode 25 consisting, for example, of vaporization-deposited aluminum. Lead **25*a* is attached to the control electrode 25, for example, by thermocompression. The conductivity of the inversion layer 23 can be controlled with the aid of the control electrode 25 by imparting to the inversion layer a given voltage relative to one of the regions 21 and 22. A barrier-free contact electrode 29 is bonded to the bottom face of the semiconductor crystal 20. The electrode 29 may be produced by alloying a foil of gold to the silicon main material. A lead 29*a* is attached to the contact electrode 29**.

According to the circuit diagram shown in FIG. 2*b* by way of example, the electrode 28 is grounded. The control electrode 25 has a voltage of $U_{ST}$ relative to the grounded electrode 28. A load circuit extends between electrodes 27 and 28 and comprises a variable voltage source 26, a current measuring instrument I and a load resistor $R_a$. The electrode 29 contacting the semiconductor main material may be grounded. However, if it is desired to control the novel diode through the semiconductor main material, a voltage $U_G$ may be impressed between the electrodes 28 and 29 as shown in FIG. 2*b*, this voltage biasing the p-n junction between 20 and 22 in the blocking (reverse) direction.

Since the avalanche breakdown, required for obtaining a negative resistance characteristic of the described semiconductor device, occurs at the locality of highest field strength, it is advisable to predetermine this locality in order to secure a defined breakdown voltage. This, according to another feature of the invention, is achieved by making the intermediate low-conductance region considerably narrower at least at one locality **23*a*** (FIG. 2*a*) than in the environment of this locality.

When a voltage U is impressed between the electrodes 27 and 28, it may happen that the inversion layer 23 will become constricted in the vicinity of the one electrode then connected to the positive pole of the voltage source. This may occur, for example, near the electrode 28, assuming that the main material 20 has p-type conductance and hence the regions 21 and 22 have n-type conductance. If such a construction takes place, the inversion layer becomes thinner in the vicinity of the electrode 28 so that the conductivity decreases at this locality. This phenomenon is augmented when a higher potential is applied to the electrode 28. The more the voltage drop along the inversion layer increases, the more strongly will the inversion layer become constricted.

If at this constriction locality the resistance $R_E$ of the constricted inversion-layer portion becomes extremely high with respect to the resistance $R_I$ of the remaining inversion layer, so that $R_I$ is negligibly small relative to $R_E$ and thus is almost equal to zero, the breakdown occurs already prior to reaching the desired voltage, and the mechanism of an avalanche injection diode cannot function.

Therefore, in cases where such a constriction of the inversion layer is apt to occur, it is important to choose a high ratio of the above-mentioned resistances $R_I/R_E$ so that the resistance $R_I$ is not negligible relative to $R_E$ and, with increasing voltage, remains capable of delaying the breakdown of a charge-carrier avalanche for a given additional voltage interval. The charge-carrier avalanche, triggered particularly by impact ionization, then takes place above this voltage interval, for example of 100 to 150 volt. At this moment, the resistance $R_I$ virtually drops to zero due to flooding of the inversion layer with charge carriers. Hence the negative portion of the current-voltage characteristic will commerce above the breakdown voltage, for example, at 100 to 200 volt, and once the breakdown has occurred, can be maintained at voltages down to a much lower value, for example 10 volt.

On the other hand, if $R_I$ is negligible relative to $R_E$, the value of $R_I$ would be virtually equal to zero from the outset. Consequently, the value of $R_I$ would not be further reduced upon occurrence of the charge-carrier avalanche so that no negative current-voltage characteristic can occur.

The desired ratio of $R_I/R_E$ can be adjusted as desired, for example by a suitable length of the current path, and consequently by giving the inversion layer 23 a corresponding length. The longer the inversion layer 23 is made, the higher is the resistance $R_I$. It is also important to employ as semiconductor main material a crystal at whose surface the lifetime of the minority carrier is not lower than about 1 $\mu$sec. after all of the above-described method steps are completed.

From the foregoing viewpoints we have found it preferable, referring to silicon devices, to use as starting material a slice of 100 to 300$\mu$ thickness and preferably about 20 mm. diameter, cut from a monocrystalline semiconductor rod having a conductivity of 5 to 1000 ohm/cm. A suitable rod is produced by crucible-free zone melting in vacuum of less than $10^{-5}$ torr pressure, preferably with at least five and up to twenty zone passes. The slices cut from such a rod are first polished mechanically, thereafter polished chemically, for example with a mixture of hydrofluoric acid and nitric acid, thereafter cleaned in nitric acid and rinsed with distilled water before being dried by blowing air against the discs.

The shape of the highly doped regions, corresponding to those denoted by 21 and 22 in FIG. 2, may also be annular, so that one of the regions forms a ring around the inversion layer 23 and the other highly doped region is entirely surrounded by the inversion layer. It is advisable to connect the outermost ring to the negative pole of the voltage source so that the entire current in the inversion layer is subjected to the influence of the insulated control electrode.

The characteristics shown in FIGS. 3 and 4 were taken with controllable semiconductor devices according to the invention as described above with reference to FIGS. 2*a* and 2*b*. In both diagrams, the abscissa indicates the voltage U (in volt) impressed between the two highly doped regions (21 and 22 in FIG. 2*a*), and the ordinate indicates the current I (in ma.) flowing through the inversion layer (23).

FIG. 3 shows three characteristics 31, 32, 33 indicative of inversion-layer current versus voltage applied to the insulated control electrode (25 in FIGS. 2*a*, *b*), the main material (electrode 29) being grounded. Curve 31 in FIG. 3 relates to a control voltage $U_1=-20$ volt. Curve 32 relates to a control voltage $U_2=0$ volt, and curve 33 corresponds to a voltage $U_3=+20$ volt. The holding voltage 30 for the particular semiconductor device with which the diagrams of FIGS. 3 and 4 were taken had the value of 20 volt between the respective contacts of the highly doped regions (27 and 28). As a rule, this holding voltage in semiconductor devices according to the invention was found to be between about 10 and 30 volt.

The parameter relative to the characteristics shown in FIG. 4 is the control current flowing in the semiconductor main material; the voltage at the control electrode (25) was kept constant. The curves 41, 42 and 43 were determined for respective control currents of 0, 0.5 and 1 ma., with the semiconductor main material (electrode 29) kept at a negative potential relative to the inversion layer. Denoted by 3 is the holding voltage (corresponding to voltage line 30 in FIG. 3). The breakdown voltages between the highly doped regions (21 and 22) in FIGS. 3 and 4 are between 90 and 140 volt. However, other semiconductor devices made according to the invention and having an $n^+$-n-$n^+$ layer sequence, exhibited a breakdown voltage up to about 200 volt.

It will be understood that the illustrated embodiments serve essentially to exemplify devices according to the invention and can be modified in various respects. In particular, the selection of the semiconductor crystals to be used is not limited to silicon, since semiconductor crystals of any other type are likewise applicable, for example germanium and $A^{III}B^{V}$ semiconductor compounds.

To those skilled in the art, it will be obvious upon a study of this disclosure that such and other modifications, including the use of such devices in other circuit connections, are readily applicable and hence will result in embodiments other than particularly illustrated and described herein, without departing from the essential features of our invention and within the scope of the claims annexed hereto.

We claim:

1. A controllable semiconductor device having a negative current voltage characteristic between two main electrodes, comprising a semiconductor monocrystal having a main portion of one conductance type and three mutually sequential regions adjacent to said main portion, the two outer ones of said regions having high extrinsic conductance of the opposed type and forming respective p-n junctions with the main portion, the intermediate region being formed as an inversion layer beneath an oxide coating between said outer regions and having low conductance different in type from the conductance of said main portion, said two outer regions being closely spaced from each other a distance sufficient to prevent mutual contact of said junctions at voltages below the breakdown limit, said intermediate region being further characterized by having a geometric restriction remotely located with respect to the locality of the predetermined point of highest field strength in the intermediate region; and four contact electrodes one each on said two outer regions forming the main electrodes, one on said oxide coating on top of said intermediate region and one on said main portion.

2. In a semiconductor device according to claim 1, said intermediate region having extrinsic conductance of said opposed type.

3. In a semiconductor device according to claim 1, said intermediate region having intrinsic conductance.

4. A semiconductor device according to claim 1, comprising circuit means connected between said respective electrodes on said main portion and on one of said outer regions for passing a control current in the reverse direction through said inversion layer, whereby said current controls the current-voltage characteristic and breakdown voltage.

5. A semiconductor device according to claim 1, comprising circuit means connected to said electrode on said oxide coating for applying a voltage to control the conductance of said intermediate region.

6. A semiconductor device according to claim 1, comprising circuit means connected between said respective electrodes on said main portion and on one of said outer regions for passing a control current in the reverse direction through said inversion layer, and voltage supply means connected to said electrode on said oxide coating for applying a control voltage thereto, whereby the conductance of said intermediate region is variable by applying said voltage as well as by passing current through said semiconductor main portion.

7. A semiconductor device according to claim 1, wherein the semiconductor monocrystal is silicon of about 100 to 300 microns thick.

8. A semiconductor device according to claim 1, wherein the semiconductor monocrystal has a conductance of 5 to 1000 ohm/cm. and a minority charge carrier lifetime of at least 1 microsecond.

9. A semiconductor device according to claim 8, wherein the spacing of the two outer regions are about 100 microns from each other.

References Cited by the Examiner

UNITED STATES PATENTS

| | | | |
|---|---|---|---|
| 2,900,531 | 8/1959 | Wallmark | 307—88.5 |
| 3,025,589 | 3/1962 | Hoerni | 307—235 |
| 3,056,888 | 10/1962 | Atalla | 317—235 |
| 3,226,611 | 12/1965 | Haenichen | 317—235 |
| 3,229,218 | 1/1966 | Sickles et al. | 317—235 |

FOREIGN PATENTS

| | | |
|---|---|---|
| 809,522 | 10/1962 | Great Britain. |

OTHER REFERENCES

Solid State Electronics, "Avalanche Injection Diodes" by Gibson et al., published by Pergamon Press, 1960, pp. 54–57 relied on.

Proceedings of the IRE, "Double Injection Diodes and Related DI Phenomena in Semiconductors" by Holonyak, December 1962, pages 2421–2428.

Proceedings of the IEEE, "The Silicon Insulated-Gate Field-Effect Transistor," by Hofstein et al., September 1963, pages 1190–1202.

JOHN W. HUCKERT, *Primary Examiner.*

J. D. CRAIG, *Assistant Examiner.*